US006703821B2

United States Patent
Dyott

(10) Patent No.: US 6,703,821 B2
(45) Date of Patent: Mar. 9, 2004

(54) FARADAY-EFFECT CURRENT SENSOR WITH IMPROVED VIBRATION RESPONSE

(75) Inventor: Richard B. Dyott, Oak Lawn, IL (US)

(73) Assignee: KVH Industries, Inc., Middletown, RI (US)

( * ) Notice: Subject to any disclaimer, the term of this patent is extended or adjusted under 35 U.S.C. 154(b) by 0 days.

(21) Appl. No.: 09/796,050

(22) Filed: Feb. 28, 2001

(65) Prior Publication Data

US 2002/0180416 A1 Dec. 5, 2002

Related U.S. Application Data

(60) Provisional application No. 60/185,675, filed on Feb. 28, 2000.

(51) Int. Cl.[7] .............................................. G01R 31/00
(52) U.S. Cl. ..................... 324/96; 250/227.17; 356/465
(58) Field of Search ............................... 324/96, 117 R, 324/224.1, 260; 250/227.17, 227.19; 356/464, 465

(56) References Cited

U.S. PATENT DOCUMENTS

| | | | |
|---|---|---|---|
| 4,372,685 A | * | 2/1983 | Ulrich .......................... 356/464 |
| 4,571,650 A | | 2/1986 | Ojima et al. |
| 4,603,931 A | | 8/1986 | Ruffman |
| 4,615,582 A | | 10/1986 | Lefevre et al. |
| 4,630,229 A | | 12/1986 | D'Hondt |
| 4,630,890 A | | 12/1986 | Ashkin et al. |
| 4,637,722 A | | 1/1987 | Kim |
| 4,668,264 A | | 5/1987 | Dyott |
| 4,669,814 A | | 6/1987 | Dyott |

(List continued on next page.)

FOREIGN PATENT DOCUMENTS

| | | |
|---|---|---|
| DE | 33 05 104 A1 | 8/1984 |
| DE | 36 15 305 A1 | 11/1987 |
| DE | 37 42 201 A1 | 6/1989 |
| EP | 0 551 874 A2 | 7/1993 |
| EP | 0 586 242 A1 | 3/1994 |
| EP | 0 686 867 A1 | 12/1995 |
| EP | 0 722 081 A2 | 7/1996 |
| EP | 856 737 A1 | 8/1998 |
| EP | 0 871 009 A1 | 10/1998 |
| EP | 0 872 756 A1 | 10/1998 |
| FR | 2 535 463 A | 5/1984 |
| JP | 07209398 | 11/1995 |
| WO | WO98/58268 A | 12/1998 |
| WO | WO 00/36425 | 6/2000 |

OTHER PUBLICATIONS

US 6,208,775, 3/2001, Dyott (withdrawn)

Alekseev et al; "Fiber Optic Gyroscope with Suppression of Excess Noise from the Radiation Source", Technical Physical Letters, 24(9): 719–721, (Sep. 1998).

Blake et al., "In–Line Sagnac Interferometer Current Sensor," IEEE, pp. 116–121 (1995). (no month).

(List continued on next page.)

*Primary Examiner*—Kamand Cuneo
*Assistant Examiner*—Minh N. Tang
(74) *Attorney, Agent, or Firm*—Foley & Hoag, LLP

(57) ABSTRACT

The invention is directed to a Faraday-type current sensor which is less susceptive to effects caused by rotation, acceleration and vibration of the sensor coil. The sensor coil of the invention includes a first coil section which forms the current sensing coil and a second coil section which is optically connected to the first coil section and forms a compensation or "bucking" coil. The optical fiber of the first coil section preferably has an almost zero birefringence and is connected in series with the optical fiber of the second coil section which preferably has a large birefringence. The illuminating radiation propagates through the sensor coil in such a way, as viewed along the coil axis, that the propagation direction of the radiation in the first coil section with respect to the coil axis is opposite from the propagation direction in the second coil section.

16 Claims, 4 Drawing Sheets

U.S. PATENT DOCUMENTS

| | | |
|---|---|---|
| 4,697,876 A | 10/1987 | Dyott |
| 4,705,399 A | 11/1987 | Graindorge et al. |
| 4,712,866 A | 12/1987 | Dyott |
| 4,733,938 A | 3/1988 | Lefevre et al. |
| 4,740,085 A | 4/1988 | Lim |
| 4,755,021 A | 7/1988 | Dyott |
| 4,765,739 A | 8/1988 | Koizumi et al. |
| 4,776,700 A | 10/1988 | Frigo |
| 4,796,993 A | 1/1989 | Sonobe et al. |
| 4,815,817 A | 3/1989 | Levinson |
| 4,842,409 A | 6/1989 | Arditty et al. |
| 4,848,910 A | 7/1989 | Dupraz |
| 4,883,358 A | 11/1989 | Okada |
| 4,887,900 A | 12/1989 | Hall |
| 4,943,132 A | 7/1990 | Huang |
| 5,033,854 A | 7/1991 | Matthews et al. |
| 5,048,962 A | 9/1991 | Kurokawa et al. |
| 5,056,919 A | 10/1991 | Arditty et al. |
| 5,063,290 A * | 11/1991 | Kersey .................. 250/227.17 |
| 5,074,665 A * | 12/1991 | Huang et al. ............... 356/465 |
| 5,080,489 A | 1/1992 | Nishikawa et al. |
| 5,096,312 A | 3/1992 | Huang |
| 5,106,193 A | 4/1992 | Fesler et al. |
| 5,133,600 A | 7/1992 | Schröder |
| 5,135,555 A | 8/1992 | Coyle, Jr. et al. |
| 5,148,236 A | 9/1992 | Blake et al. |
| 5,289,257 A | 2/1994 | Kurokawa et al. |
| 5,289,258 A | 2/1994 | Szafraniec et al. |
| 5,331,404 A | 7/1994 | Moeller et al. |
| 5,351,123 A | 9/1994 | Spahlinger |
| 5,359,413 A | 10/1994 | Chang et al. |
| 5,365,338 A | 11/1994 | Bramson |
| 5,406,370 A * | 4/1995 | Huang et al. ............... 356/465 |
| 5,412,471 A | 5/1995 | Tada et al. |
| 5,457,532 A | 10/1995 | August et al. |
| 5,459,575 A | 10/1995 | Malvern |
| 5,469,257 A | 11/1995 | Blake et al. |
| 5,469,267 A | 11/1995 | Wang |
| 5,471,301 A | 11/1995 | Kumagai et al. |
| 5,475,772 A | 12/1995 | Hung et al. |
| 5,493,396 A | 2/1996 | Sewell |
| 5,500,909 A | 3/1996 | Meier ......................... 385/12 |
| 5,504,684 A | 4/1996 | Lau et al. |
| 5,513,003 A | 4/1996 | Morgan |
| 5,552,887 A | 9/1996 | Dyott |
| 5,559,908 A | 9/1996 | August et al. |
| 5,602,642 A * | 2/1997 | Bergh et al. ................ 356/464 |
| 5,644,397 A | 7/1997 | Blake |
| 5,654,906 A | 8/1997 | Youngquist |
| 5,655,035 A | 8/1997 | Burmenko |
| 5,682,241 A | 10/1997 | Mark et al. |
| 5,696,858 A | 12/1997 | Blake |
| 5,701,177 A | 12/1997 | Kumagai et al. |
| 5,701,376 A | 12/1997 | Shirasaki |
| 5,767,509 A | 6/1998 | Cordova et al. |
| 5,781,675 A | 7/1998 | Tseng et al. |
| 5,854,864 A | 12/1998 | Knoesen et al. |
| 5,898,496 A | 4/1999 | Huang et al. |
| 5,946,097 A | 8/1999 | Sanders et al. |
| 5,953,121 A * | 9/1999 | Bohnert et al. ........ 250/227.19 |
| 5,987,195 A | 11/1999 | Blake |
| 6,023,331 A | 2/2000 | Blake et al. |
| 6,025,915 A | 2/2000 | Michal et al. |
| 6,047,095 A | 4/2000 | Knoesen et al. |
| 6,075,915 A | 6/2000 | Koops et al. |
| 6,148,131 A | 11/2000 | Geertman |
| 6,163,632 A | 12/2000 | Rickman et al. |
| 6,185,033 B1 | 2/2001 | Bosc et al. |
| 6,188,811 B1 | 2/2001 | Blake |
| 6,233,371 B1 | 5/2001 | Kim et al. |
| 6,301,400 B1 | 10/2001 | Sanders |
| 6,307,632 B1 | 10/2001 | Blake |
| 6,351,310 B1 | 2/2002 | Emge et al. |
| 6,356,351 B1 | 3/2002 | Blake |
| 6,370,289 B1 | 4/2002 | Bennett |
| 6,434,285 B1 | 8/2002 | Blake et al. |
| 6,535,654 B1 | 3/2003 | Goettsche et al. |

OTHER PUBLICATIONS

Blake and Szafraniec, "Random Noise in PM and Depolarized Fiber Gyros", OSA Symposium Proceedings, 1997, OWB2, pp. 122–125. (no month).

Bohnert. et al., "Field Test of Interferometric Optical Fiber High–Voltage and Current Sensors" *SPIE*, vol. 2360 pp. 16–19 (Feb. 1994).

Bohnert. et al., "Temperature and Vibration Insensitive Fiber–Optic Current Sensor" *ABB*, vol. 2360 pp. 336–339 (Feb. 1994).

Burns, et al., "Excess Noise in Fiber in Gyroscope Sources", IEEE Photonics Technology Letter, vol. 2, No. 8, Aug. 1990, pp. 606–608.

Clark et al., "Application of a PLL and ALL Noise Reduction Process in Optical Sensing System," *IEEE Translations on Industrial Electronics*, vol. 44, No. 1, Feb. 1997, pp. 136–138.

Dagenais et al., "Low–Frequency Intensity Noise Reduction for Fiber–Optic Sensor Applications," *Optical Fiber Sensors Conference*, 1992, Jan. 29–31, pp. 177–180.

Dupraz, J.P., "Fiber–Optic Interferometers for Current Measurement: Principles and Technology", Alsthom Review No. 9:29–44 (Dec. 1987).

Frosio, G. and Dändliker, "Reciprocal Reflection Interferometer for a Fiber–Optic Faraday Current Sensor", Applied Optics 33 (25): 6111–6122 (Sep. 1, 1994).

Gronau Yuval et al.; "Digital Signal Processing For an Open–Loop Fiber–Optic Gyroscope", Applied Optics, Optical Society of America, Washington, U.S., vol. 34, No. 25, Sep. 1, 1995, pp. 5849–5853.

Killian M. Kevin; "Pointing Grade Fiber Optic Gyroscope", IEEE AES Systems Magazine, pp. 6–10 (Jul. 1994).

LaViolette and Bossler: "Phase Modulation Control for An Interferometric Fiber Optic Gyroscope", IEEE Plan 90, Position Location and Navigation Symposium, Las Vegas, (Mar. 20–23, 1990).

Lafevre, "The Fiber–Optic Gyroscope", Artech House, Boston, pp. 29–30 (1993). (no month).

McCallion and Shimazu; "Side–Polished Fiber Provides Functionality and Transparency", Laser Focus World, 34 (9): S19–S24, (Sep. 1, 1998).

Moeller and Burns, "1.06mm All–fiber Gyroscope with Noise Subtraction Proceedings of the Conference on Optical Fiber Sensors", IEEE–OSA, Monterey, CA, 1992, pp. 82–85 (no month).

Moeller and Burns, "Observation of Thermal Noise in a Dynamically Biased Fiber–Optic Gyro", Optical Letters, 1996, vol. 21, pp. 171–173. (no month).

Nikos Drakos, "Circularization States for Light, and Quarter–Wave Plates," *Computer Based Learning Unit, University of Leeds*, Mar. 2, 1998).

Ono et al.; "A Small–Sized, Compact, Open–loop Fibre–Optic Gyroscope with Stabilized Scale Factor", Meas. Sci. Technol. 1: 1078–1083, (1990 (no month).

Polynkin et al.; "All–Optical Noise–Subtraction Scheme for a Fiber–Optic Gyroscope", Optics Letters, 25(3): 147–149, (Feb. 1, 2000).

Rabelo et al.; "SNR Enhancement of Intensity Noise–Limited FOGs", Journal of Lightwave Technology 18(12):2146–2150 (Dec. 2000).

Short, S. et al., "Elimination of Birefringence Induced Scale Factor Errors in the In–Line Sagnac Interferometer Current Sensor", Journal of Lightwave Technology 16 (10): 1844–1850 (Oct. 1998).

* cited by examiner

US 6,703,821 B2

FARADAY-EFFECT CURRENT SENSOR WITH IMPROVED VIBRATION RESPONSE

CROSS-REFERENCE TO OTHER APPLICATIONS

This application claims the benefit of U.S. provisional application Serial No. 60/185,675, filed Feb. 28, 2000.

FIELD OF THE INVENTION

The invention relates to Faraday-effect type current sensors, and more particularly to a sensor coil with improved immunity to mechanical effects, in particular rotation and vibration of the coil.

BACKGROUND OF THE INVENTION

Fiber-optic devices are attractive for sensing a magnetic field induced by an electric current, in particular if the electric current is carried by wires having a substantial electric potential with respect to ground. Such fiber-optic current sensors can be made quite small and can be constructed to withstand considerable mechanical shock, temperature change, and other environmental extremes. Due to the absence of moving parts, they can be nearly maintenance free, and they have the potential of becoming economical in cost.

A fiber-optic current sensor has an optical fiber wound in the form of a coil which surrounds the current-carrying wire of which the current is to be sensed. The coil may have one turn to several hundred turns, and is part of a closed optical path in which an electromagnetic wave, such as a light wave, is introduced. The light is typically circularly polarized with opposite polarization directions, with the opposite polarization directions forming counter-propagating waves which traverse the coil in clockwise (cw) and counterclockwise (ccw) directions. The counter-propagating waves are then recombined and impinge on a photodetector. As a result of the magnetic-field induced Faraday effect, the optical rotation increases in one polarization direction (for example, cw) and decreases in the other polarization direction (in this example, ccw). The opposite result occurs for current flow in the other direction. The difference in the optical rotation between the counter-propagating waves introduces a phase shift between these waves, which is known as the Faraday effect.

In general, there may be reasons why the fiber-optic current sensor does not give the expected current sensing accuracy. One of these is due to the presence of vibration or angular rotation. Vibrations can produce a phase shift via the rotational motion of the sensing coil (the Sagnac effect). The sensor is, in effect, both a gyro and a current sensor; responding to angular rotation as well as to magnetic field. For example, a sensing coil having a diameter of 137 mm and 4 turns of fiber has a Verdet constant of $2.5 \times 10^{-6}$ radians/Ampere-turn, the optical phase shift produced by an angular rotation of the coil of 1°/sec is equivalent to that produced by a current of 100 Amps. Such a rotation would be produced by an azimuth displacement of 240 $\mu$m at the outer diameter of the coil at a vibrational frequency of 50 Hz.

Another cause of optical phase difference shift $\delta$ at angular frequency $\omega_v$ due to vibration is that of an actual angular vibration which induces a true AC rotation rate. This effect takes the same functional form for a vibration-induced phase difference modulation $$\delta = \Delta \psi_v \cos(\omega_v t + \epsilon).$$

The output of the current sensor will correctly indicate the actual magnetic field environment, but the output will vary at $\omega_v$.

It would therefore be desirable to provide a current sensor which is only slightly or not at all affected by vibrations in the current sensor coil.

SUMMARY OF THE INVENTION

According to one aspect of the invention, the effect arising from sensing coil vibrations and rotation can be substantially reduced or even eliminated by forming a fiber-optic current sensor coil of a fiber sensing coil section made of a first fiber that has substantially no birefringence and is wound in a first winding direction about an axis; and at least one "bucking" coil made of a second fiber that has a large birefringence and is wound in a second winding direction about the same axis. The first fiber and the second fiber of the at least one fiber bucking coil section are connected to one another so that optical radiation, when viewed along the axis, propagates through the first fiber in a direction opposite to the direction of the light propagating through the second fiber. The at least one fiber bucking coil section is insensitive to the Faraday effect and has substantially the same effective total area as the current sensing coil section.

The bucking coil is advantageously placed adjacent to the current sensing coil and is bonded to it so that both coils experience substantially identical rotation, acceleration or vibration. The first and second fiber can also be placed next to each other during the winding operation or bonded to one another before the winding operation. The bucking coil can be a highly birefringent fiber, such as an elliptically cored fiber, which is insensitive to the Faraday effect. At least one first quarter wave plate can be disposed in a region where the first fiber of the current sensing coil section and the second fiber of the at least one fiber bucking coil section are connected to one another.

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF CERTAIN ILLUSTRATED EMBODIMENTS

The invention is directed to a novel fiber-optic (FO) coil configuration for a Faraday-type current sensor which is less susceptive to angular rotation, acceleration and vibrations. In particular, the FO coil can be inserted at any location in the FO current sensing loop.

Figure 5:
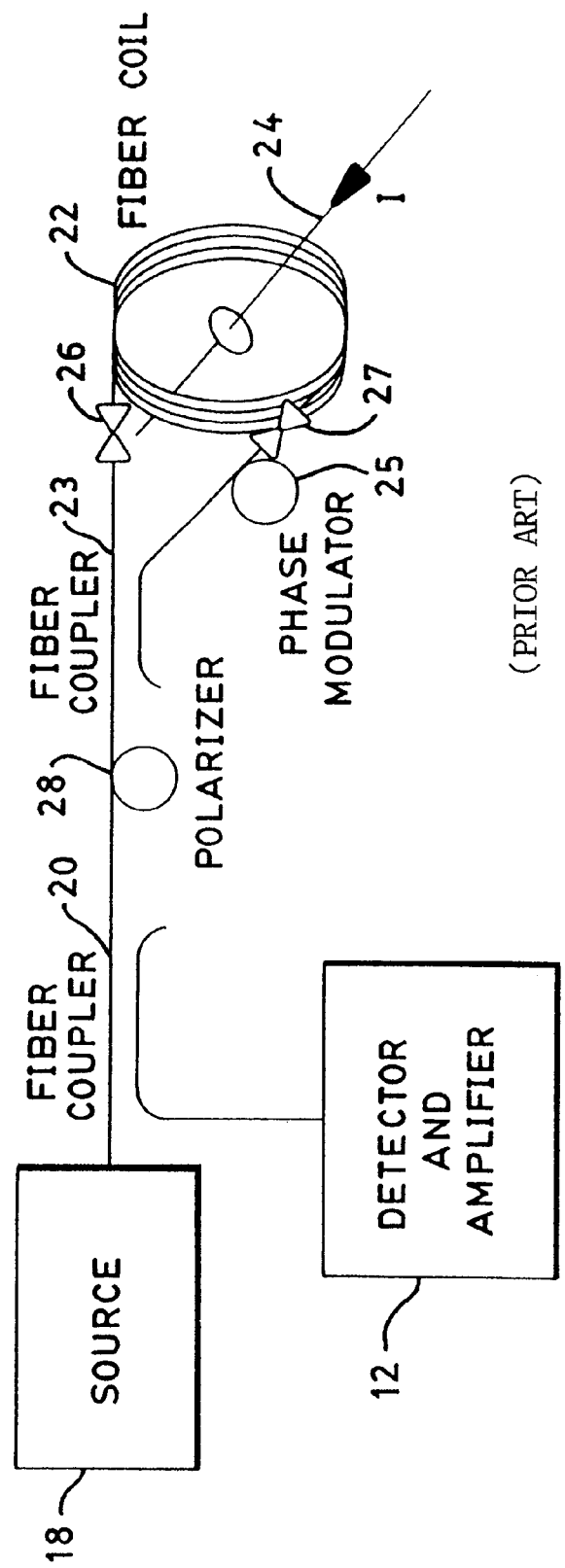
FIG. 5 is a schematic diagram of a conventional current sensor configuration.

Referring first to FIG. 5, by way of background information, a conventional fiber-optic sensor 10 includes a light source 18, which may be a broad-spectrum superluminecent source (SLS) exhibiting superluminescence or superfluorescence, as has been observed in high-gain laser materials which are operated below lasing threshold or as an essentially single-pass amplifier of spontaneous photons without the use of an optical resonator. One example of an SLS is a superluminescent diode (SLD). Alternatively, a superluminescent fiber source (SFS) may be employed which has an improved temperature stability over that of a semiconductor SLS. In addition, the available power in an SFS is significantly higher than that of a SLD. The light source may be polarized or unpolarized. A laser diode operating below lasing threshold can also be used.

The light source 18 is coupled to an input coupler 20 which is implemented as a directional coupler. A first portion of the light emerging from the input coupler 20 is transmitted through a polarizer 28 which produces linearly polarized light. A second coupler 23 launches two counter-propagating light beams into the respective ends of the fiber sensing coil 22. In a current sensor, λ/4 wave plates 26, 27 are inserted between the source and the fiber sensing coil to convert the linearly polarized light into circularly polarized light. The phase of these counter-propagating light beams is modulated by phase modulator 25 when the respective counter-propagating light beams enter or exit the fiber sensing coil 22 at the respective coil ends. A detector 12 is coupled to a return tap of fiber coupler 20 and measures the optical power of the interference light produced by an interference of the counter-propagating light beams combined in fiber coupler 23. As is known in the art, each of the counter-propagating light beams experiences a Faraday rotation by the magnetic field produced by the electric current flowing through wire 24, so that the optical power of the interference light is in first approximation proportional to the electric current. However, the interference light also includes, in addition to the desired current signal, components arising from a rotation or vibration of the FO sensing coil 22, since in the Sagnac configuration the sensing coil 22 operates not only as a current sensor, but also as a gyroscope.

The λ/4 wave plates 26, 27 can be implemented, for example, as a polarization transformers of the type disclosed in the commonly assigned U.S. patent application Ser. No. 09/337,223 to Dyott. It will further be appreciated by those skilled in the art that the fiber sensing coil 22 is only representative of an optical waveguide configuration and that other optical waveguides, such as integrated waveguide structures, for example, thin film waveguides formed on a suitable substrate, may be used instead of or in addition to the optical fiber of the fiber sensing coil 22.

Figure 1:
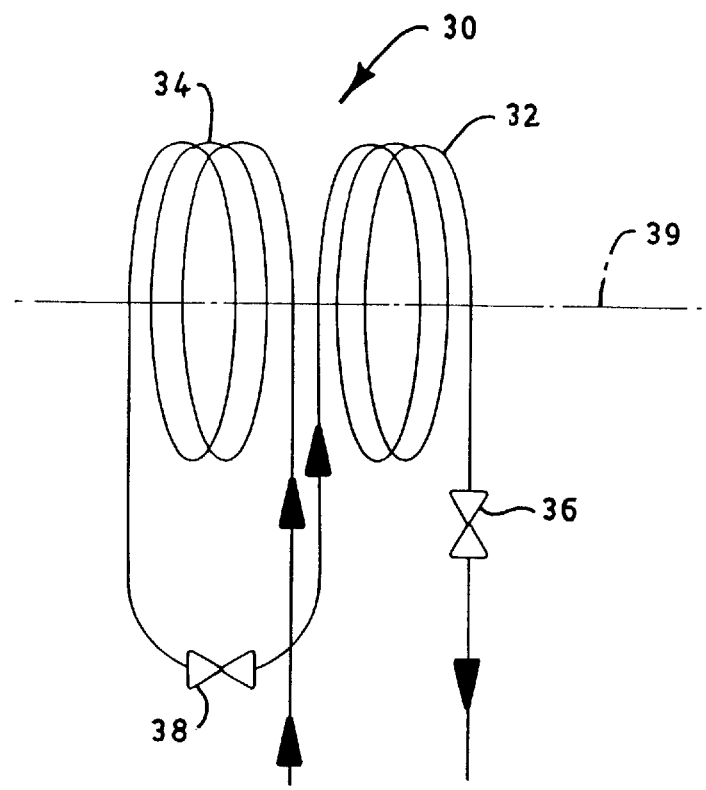
FIG. 1 is a schematic diagram of a first embodiment of a fiber sensing coil arrangement according to the invention.

Referring now to FIG. 1, a FO current sensing coil 30 according to the invention, which is less susceptive to vibrations and may be substituted for the fiber sensing coil 22 of FIG. 5, includes a first coil section 32 forming the current sensing coil and a second coil section 34 optically connected to the first coil section 32 and forming a compensation or "bucking" coil. The first coil section 32 is formed of a first optical fiber, preferably a fiber having a low birefringence, which is wound in the form of a coil about a coil axis 39 with a first winding direction. In this coil section 32, the group velocity of the propagated radiation is independent of the polarization direction of the radiation. For this reason, coils made of low- or zero-birefringence fiber are commonly used for FO current sensors where the polarization state of the radiation is altered by the current-induced magnetic field.

The second coil section 34 is formed of a second optical fiber, preferably a fiber having a large birefringence, sometimes also referred to as polarization-maintaining (PM) fiber, which is wound in the form of a coil about essentially the same coil axis 39, and encircling the current carrying conductor with a second winding direction opposite to the first winding direction. A large birefringence maintains the polarization state of the wave launched into the second optical fiber in the presence of the current-induced magnetic field. The first optical fiber of the first coil section 32 is connected in series to the second optical fiber of the second coil section 34 in such a way that, as viewed along the axis 39, the optical radiation propagates, for example, through the first coil section 32 clockwise and then through the second coil section 34 counterclockwise. A first λ/4 waveplate 38, also referred to as a "polarization transformer", is inserted between the sections 32 and 34 in a current-sensing configuration, and a second λ/4 waveplate 36 is inserted at the other end of the first coil section 32. As mentioned above, because of the insensitivity of the high-birefringence second coil section 34 to the magnetic field, only the radiation propagating in the first coil section 32 responds to the magnetic field. However, if the coil 30 formed of the two coil sections 32, 34 rotates or is subjected to vibrations, a phase shift induced in the first coil section 32 is compensated by a corresponding opposite phase change in the second coil, and vice versa, if both coil sections experience identical rotation/vibration characteristics. For this reason, the coil sections 32, 34 are preferably intimately coupled to one another, as discussed below.

Figure 2:
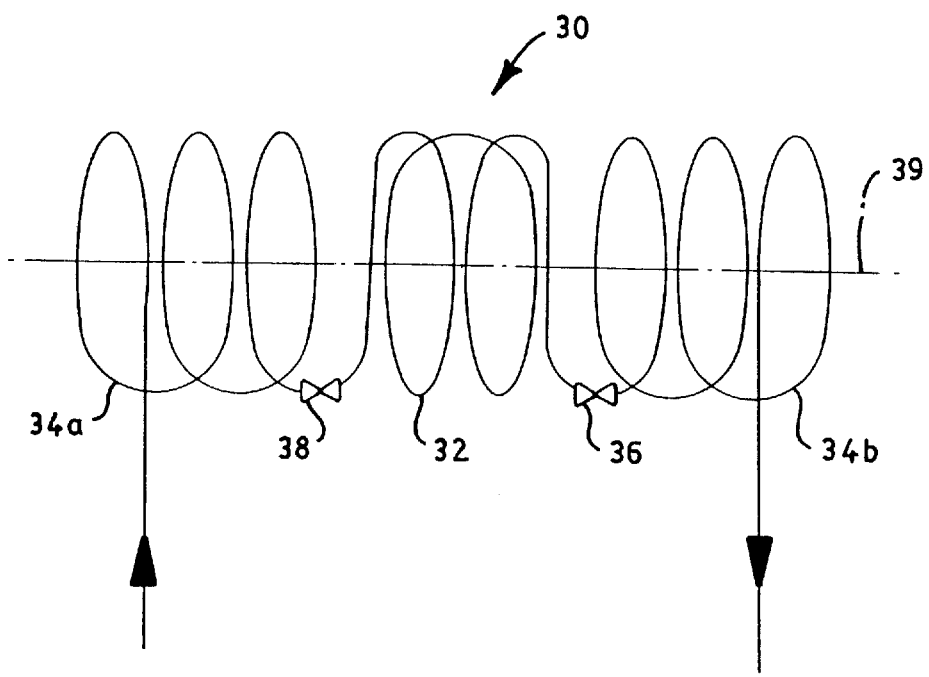
FIG. 2 is a schematic diagram of a second embodiment of a fiber sensing coil arrangement according to the invention.

The invention is not limited to a single current sensing coil 32 and a single bucking coil 34. FIG. 2 depicts a second embodiment of the invention in which the bucking coil 34 is subdivided into two bucking coil sections 34a and 34b which can be arranged symmetrically with respect to the current sensing coil 32 to reduce asymmetric effects in the coil assembly 30 caused by the rotation or vibrations. The two bucking coil sections 34a and 34b are wound in the same direction, which is opposite to the winding direction of the current sensing coil 32. As seen from FIGS. 1 and 2, λ/4 wave plates 36, 38 are disposed proximate to the end sections of the current sensing coil 32 between the current sensing coil 32 and the bucking coil 34 (FIG. 1) or the respective bucking coil sections 34a, 34b (FIG. 2) to convert linearly polarized radiation to circularly polarized radiation, and vice versa, as discussed above.

Figure 3:
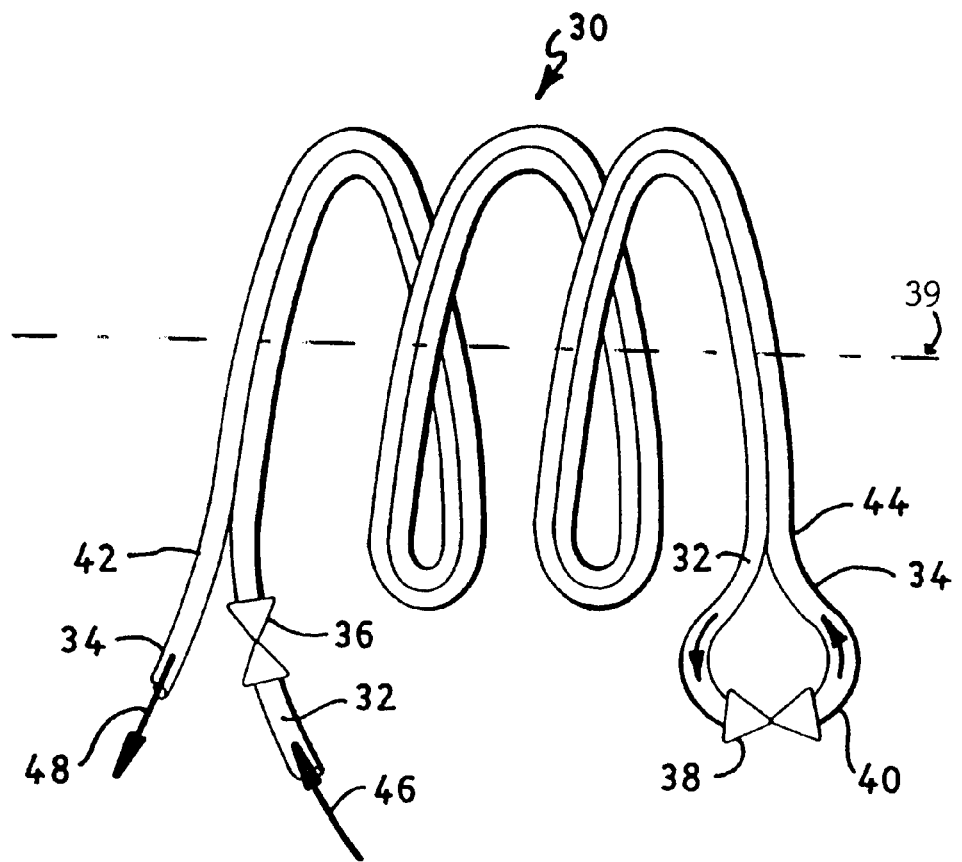
FIG. 3 is a schematic diagram of a third embodiment of a fiber sensing coil arrangement according to the invention.

It will, however, be understood by those skilled in the art that the coil 32 and the respective coil(s) 34, 34a, 34b do not have to be actually physically wound in opposite direction, but only have to be connected in such a way that the propagation direction of the radiation in those coils with respect to the axis 39 is reversed, as schematically shown in FIG. 1. Moreover, the coil section 32 and the respective coil(s) 34, 34a, 34b can be co-wound as a single strand coming from separate fiber stock, as indicated in FIG. 3. In this way, the radiation experiences almost identical vibrational effects when traversing the coil 30. Radiation entering the fiber of coil section 32, for example, at the end 46, first traverses one of the λ/4 wave plates 36, then passes through the sensing coil 32 made of low-birefringence fiber, reverses direction with respect to axis 39 in loop 40 which includes the other λ/4 wave plate 38, then enters the PM fiber 34, and exits the PM fiber 34 at the end 48. The counter-propagating beam travels in the opposite direction, entering at end 48 and exiting at end 46.

In an alternative embodiment, fiber loop 40 may be replaced with a fused fiber reflector or with a directional 3 dB coupler, which are known in the art and will not be further described at this point.

Figure 4:
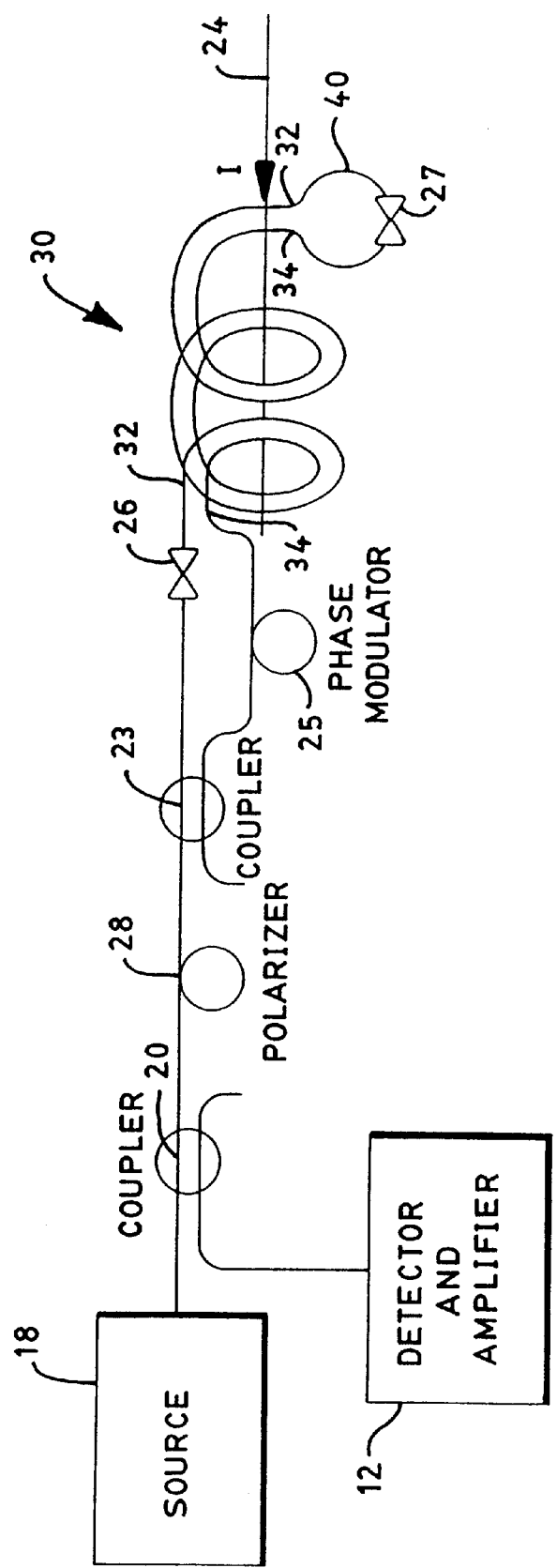
FIG. 4 is a schematic diagram of a current sensor configuration using the fiber sensing coil arrangement of FIG. 3.

Referring now to FIG. 4, a current sensor with reduced susceptibility to vibrations and sensor rotation includes, like the current sensor of FIG. 5, a radiation source 18, an input coupler 20, and a polarizer 28. A second coupler 23 launches two counter-propagating light beams into the respective ends of the fiber sensing coil 30 having a reduced susceptibility to vibrations. FIG. 4 shows the embodiment of coil 30 according to FIG. 3, although any of the current sensor coils illustrated in FIGS. 1–3 can be employed. The current sensor can also be a reduced minimum configuration (RMC) current sensor of the type disclosed, for example, in commonly assigned U.S. patent application Ser. No. 09/615,166 to S. Bennett and R. Dyott, which is incorporated herein by reference.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

What is claimed is:

1. A fiber-optic current sensor coil comprising:
   a first fiber having substantially no birefringence and being wound in a first winding direction about an axis to form a fiber sensing coil section, and
   a second fiber having a large birefringence and being wound in a second winding about the axis to form a fiber bucking coil section,
   wherein the first fiber and the second fiber are connected to one another so that optical radiation propagating through the first fiber goes around the axis in a direction opposite to the direction the optical radiation propagating through the second fiber goes around the axis.

2. The fiber-optic current sensor coil of claim 1, further comprising a quarter wave plate disposed at a connection between the first fiber and the second fiber.

3. The fiber-optic current sensor coil of claim 1, wherein the fiber bucking coil section is disposed so as to be subjected to substantially identical rotation, acceleration or vibration as the fiber sensing coil section.

4. The fiber-optic current sensor coil of claim 3, wherein the first fiber and the second fiber are wound substantially adjacent to one another along substantially the entire length of the fiber sensing coil section.

5. A fiber-optic current sensor coil comprising:
   a sensor coil section having a first end and a second end and comprising a first fiber having substantially no birefringence,
   at least one bucking coil section having a first end and a second end and comprising a second fiber having a large birefringence, said sensor coil section and said at least one bucking coil section having a common axis and being disposed so as to be subjected to substantially identical rotation, acceleration or vibration, and
   for said at least one bucking coil section, a quarter wave plate connected between an end of the sensor coil section and an end of the said bucking coil section,
   wherein said at least one bucking coil section is in optical communication with the sensor coil section so that radiation, which propagates through the sensor coil section in a first direction around the common axis, propagates through said at least one bucking coil section in a direction around the common axis opposite to the first direction.

6. The fiber-optic sensor coil of claim 5, wherein the effective total area of said at least one bucking coil section is substantially the same as the effective total area of the sensor coil section.

7. The fiber-optic current sensor coil of claim 5, wherein there is one bucking coil section.

8. The fiber-optic current sensor coil claim 7, wherein the bucking coil section and the sensor coil section are wound substantially adjacent to one another along substantially the entire length of the sensor coil section.

9. The fiber-optic current sensor coil of claim 5, wherein there are two bucking coil sections.

10. A fiber-optic magnetic field sensor comprising:
    an illuminator which produces polarized optical radiation;
    a fiber-optic coil having two fiber ends, the two ends adapted to receive the polarized optical radiation, the coil comprising:
    a sensor coil section comprising a first fiber having substantially no birefringence, and
    at least one bucking coil section connected to the sensor coil section, comprising a second fiber having a large birefringence, said sensor coil section and said at least one bucking coil section having a common axis and being disposed so as to be subjected to substantially identical rotation, acceleration or vibration,
    wherein the sensor coil section is connected to said at least one bucking coil section so that radiation, which propagates along an optical path through the sensor coil section in a first direction around the common axis, propagates through said at least one bucking coil section in a direction around the common axis opposite to the first direction;
    for said at least one bucking coil section, a quarter wave plate in the optical path where the sensor coil section is connected to the said bucking coil section; and
    a detector responsive to a magnetic field induced phase shift between the polarized optical radiation propagating through the fiber optic coil and received at the first fiber end, and the polarized optical radiation propagating through the fiber optic coil and received at the second fiber end.

11. The fiber-optic magnetic field sensor of claim 10, wherein there is one bucking coil section.

12. The fiber-optic magnetic field sensor of claim 11, wherein the bucking coil section and the sensor coil section are wound substantially adjacent to one another along substantially the entire length of the sensor coil section.

13. The fiber-optic magnetic field sensor of claim 10, wherein there are two bucking coil sections.

14. A method of producing a fiber-optic current sensor coil comprising:
    winding a first fiber having substantially no birefringence in a first winding direction about an axis to form a fiber sensing coil section, and
    winding a second fiber having a large birefringence in a second winding direction opposite to the first winding direction about the axis to form a fiber bucking coil section, and
    connecting the first fiber and the second fiber to one another so as to form an optical path to transmit radiation from the first fiber to the second fiber,
    wherein the optical radiation propagating through the first fiber goes around the axis in a direction opposite to the direction the optical radiation propagating through the second fiber goes around the axis.

15. The method of claim 14, wherein the action of connecting further includes inserting a quarter wave plate between the first fiber and the second fiber.

16. The method of claim 14, wherein winding includes placing the first fiber and the second fiber substantially next to one another during winding and securing the first fiber and the second fiber in place so that the first fiber and the second fiber are disposed so as to be subjected to substantially identical rotation, acceleration or vibration.

* * * * *